(12) United States Patent
Schultz

(10) Patent No.: US 8,969,102 B2
(45) Date of Patent: Mar. 3, 2015

(54) TESTING AN ELECTRICAL CONNECTION OF A DEVICE CAP

(71) Applicant: Peter S. Schultz, Gilbert, AZ (US)

(72) Inventor: Peter S. Schultz, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 6 days.

(21) Appl. No.: 13/887,233

(22) Filed: May 3, 2013

(65) Prior Publication Data

US 2014/0329344 A1 Nov. 6, 2014

(51) Int. Cl.
*H01L 21/66* (2006.01)
*G01R 31/26* (2014.01)
*G01R 31/04* (2006.01)

(52) U.S. Cl.
CPC .............. *G01R 31/041* (2013.01); *H01L 22/14* (2013.01)
USPC ........ 438/14; 438/50; 438/133; 257/E21.305; 257/E21.327; 257/E21.499; 257/E21.521; 257/E21.614

(58) Field of Classification Search
USPC .......... 438/14, 50, 51, 52, 133; 257/E21.305, 257/E21.327, E21.499, E21.521, E21.614
See application file for complete search history.

(56) References Cited

U.S. PATENT DOCUMENTS

| | | | |
|---|---|---|---|
| 7,042,228 B2 * | 5/2006 | Lally et al. | 324/527 |
| 7,487,661 B2 * | 2/2009 | Ueda et al. | 73/1.39 |
| 8,531,848 B2 * | 9/2013 | Gabara | 361/763 |

* cited by examiner

*Primary Examiner* — David Nhu

(57) ABSTRACT

A method of testing a device includes setting a potential of a cap terminal of the device to a first voltage, setting a potential of a self test plate of the device to a testing voltage, and detecting a first displacement of a proof mass of the device when the cap terminal is set to the first voltage and the self test plate is set to the testing voltage. The method includes setting a potential of the cap terminal of the device to a second voltage, detecting a second displacement of the proof mass of the device when the cap terminal is set to the second voltage and the self test plate is set to the testing voltage, and comparing the first displacement and the second displacement to evaluate an electrical connection between the cap terminal and a cap of the device.

19 Claims, 5 Drawing Sheets

TESTING AN ELECTRICAL CONNECTION OF A DEVICE CAP

FIELD OF THE INVENTION

Embodiments of the inventive subject matter relate to device self-test and more specifically to device self-test to verify a cap electrical connection.

BACKGROUND OF THE INVENTION

Microelectromechanical Systems (MEMS) devices are widely used in applications such as automotive, inertial guidance systems, and household appliances, protection systems for a variety of devices, and many other industrial, scientific, and engineering systems, such as in switches, pumps and motors. Such MEMS devices are used to sense a physical condition such as acceleration, pressure, or temperature, and to provide an electrical signal representative of the sensed physical condition.

MEMS devices may have parts moving mechanically under the influence of an external energy (acoustic, thermal, or optical), a temperature or voltage difference, or an external force or torque. Certain MEMS devices with a membrane, plate or beam can be used as inertial sensors.

In a MEMS device, the mechanically moving parts are sometimes fabricated together with the sensors and actuators in the process flow of an electronic integrated circuit (IC) on a semiconductor chip. Because of the moving and sensitive parts, MEMS devices may have a need for physical and atmospheric protection. Consequently, MEMS devices are surrounded by a housing or package, which shields the MEMS device against ambient and electrical disturbances, and against stress.

In the specific case of MEMS devices operating as accelerometers, for example, multiple devices may be fabricated over a single semiconductor wafer. After the devices are formed over the semiconductor wafer, a cap wafer is secured over the fabricated devices. After the substrate is singulated, the portions of the cap wafer covering each device become shields for the devices' moveable internal parts.

In addition to providing environmental protection, to provide electrical isolation and thereby allow for accurate operation of the MEMS device, the cap may also hold a given electrical potential. Generally, a wire or other conductive medium connects the cap to a cap terminal located in a base of the MEMS device. The desired cap potential is then applied to that terminal. Sometimes, however, the electrical connection between the cap terminal and the cap itself can become disconnected. The failure may be due to wire bond failure, for example. Unfortunately, in conventional MEMS devices, these failures can be difficult to detect and can result in a malfunctioning device.

BRIEF DESCRIPTION OF THE DRAWINGS

The following detailed description of a preferred embodiment of the invention will be better understood when read in conjunction with the appended drawings. The present invention is illustrated by way of example and is not limited by the accompanying figures in which like references indicate similar elements. It is to be understood that the drawings are not to scale and have been simplified for ease of understanding the invention.

DETAILED DESCRIPTION

In overview, the present disclosure describes a system and method for device self-test and more specifically to a system and method for device self-test to verify a cap electrical connection.

The instant disclosure is provided to further explain in an enabling fashion the best modes, at the time of the application, of making and using various embodiments in accordance with the present disclosure. The disclosure is further offered to enhance an understanding and appreciation for the inventive principles and advantages thereof, rather than to limit in any manner the scope of the invention.

It is further understood that the use of relational terms, if any, such as first and second, top and bottom, and the like are used solely to distinguish one entity or action from another without necessarily requiring or implying any actual such relationship or order between such entities or actions.

Much of the inventive functionality and many of the inventive principles can be implemented with or in integrated circuits (ICs) including possibly application-specific ICs or ICs with integrated processing or control or other structures. It is expected that one of ordinary skill, when guided by the concepts and principles disclosed herein, will be readily capable of generating such ICs and structures with minimal experimentation. Therefore, in the interest of brevity and minimization of any risk of obscuring the principles and concepts according to below-described embodiments of the present invention, further discussion of such structures and ICs, if any, will be limited to the essentials with respect to the principles and concepts of the various embodiments.

The different elements of a MEMS device may be produced utilizing current and upcoming surface micromachining techniques of deposition, patterning, etching, and so forth. Accordingly, although different shading and/or hatching may be utilized in the illustrations, the different elements within MEMS device may be formed out of the same material, such as polysilicon, single crystal silicon, and the like.

The elements of a MEMS device (discussed below) may be described variously as being "attached to," "attached with,"

"coupled to," "fixed to," or "interconnected with," other elements of the MEMS device. However, it should be understood that the terms refer to the direct or indirect physical connections of particular elements of the MEMS device that occur during their formation through patterning and etching processes of MEMS fabrication.

Figure 1A:
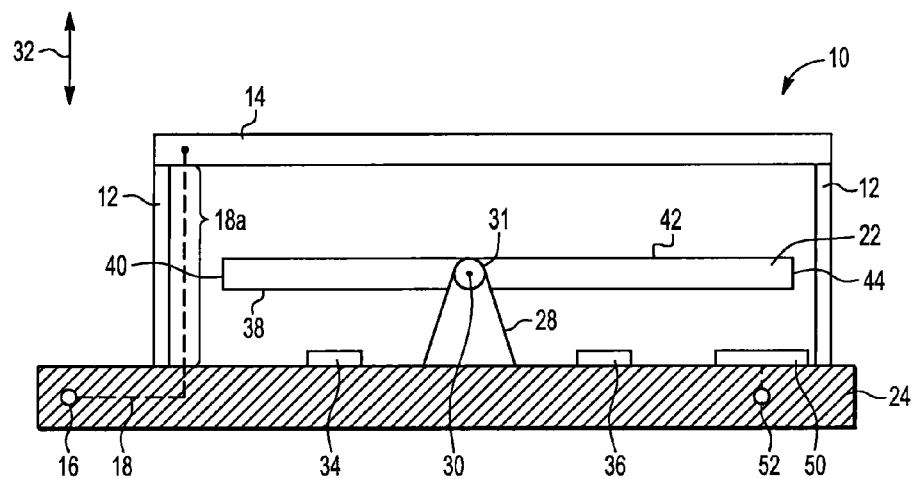
FIG. 1A is a side view of a conventional MEMS device and FIG. 1B is a top view of the MEMS device of FIG. 1A where a cap of the MEMS device has been removed.
Figure 1B:
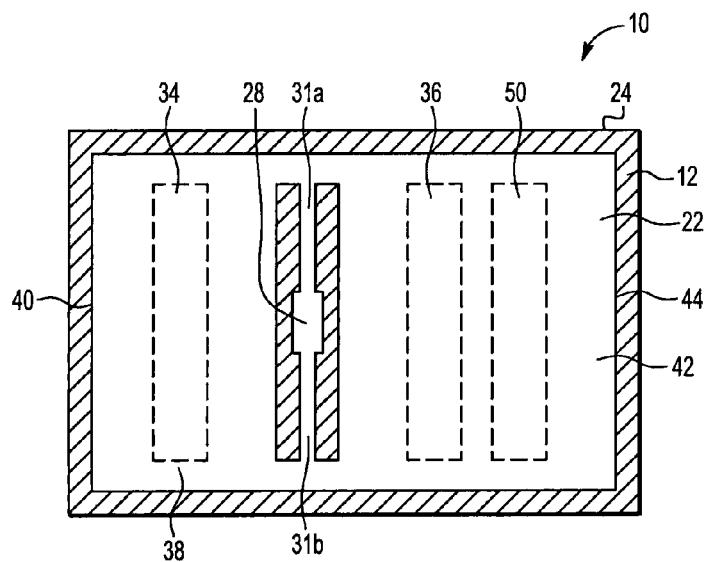

FIG. 1A is a side view of conventional MEMS device 10 and FIG. 1B is a top view of MEMS device 10 of FIG. 1A where cap 14 has been removed. In this example, MEMS device 10 is an accelerometer configured to detect an acceleration in a vertical (Z-axis) direction (see arrow 32 on FIG. 1A). MEMS device 10 may include a two layer capacitive transducer having a "teeter-totter" or "see saw" configuration, for example. MEMS device 10 includes a movable element or plate, referred to as proof mass 22 suspended above a substrate 24. For example, proof mass 22 may be constructed from a polysilicon material that is doped to be conductive. Proof mass 22 is flexibly suspended above substrate 24 by anchor 28 coupled to the underlying substrate 24. Proof mass 22 is configured to rotate about axis 30 of rotational flexure 31 (including first and second flexures 31a and 31b as shown in FIG. 1B) under z-axis acceleration, represented by an arrow 32, relative to substrate 24.

MEMS device 10 can measure two distinct capacitances between proof mass 22 and two sense plates 34 and 36 that are symmetrically located relative to rotational axis 30 in order to determine differential or relative capacitance. The side view of MEMS device 10 in FIG. 1A depicts proof mass 22 in a neutral position, i.e., an initial position or a position that proof mass 22 returns to when proof mass 22 is not subjected to a measurable z-axis acceleration, or electrostatic force (e.g., resulting from a self test plate potential or due to a potential of cap 14 being different than that of proof mass 22).

Proof mass 22 includes first section 38 between rotational axis 30 and a first end 40 of proof mass 22, and a second section 42 between rotational axis 30 and a second end 44 of proof mass 22. A length of first section 38 is shorter than a length of second section 42. Because proof mass 22 is constructed to have a consistent density throughout the length of proof mass 22, the different lengths of sections 38 and 42 will cause proof mass 22 to rotate in response to z-axis acceleration because the weight of second section 42 is greater than the weight of first section 38. Alternatively, this may also be accomplished with equal lengths of the sections of proof mass 22, by adding mass to one side of proof mass 22 (which may be accomplished with an increased width of second section 42 of the proof mass 22, for example, allowing second section 42 of proof mass 22 to have more mass than first section 38). Proof mass 22 may also move in response to applied electrostatic forces caused by changes in potential of the conductive plates near proof mass 22, like self test plate 50, or cap 14

Various components of MEMS device 10 are disposed within a volume surround by walls or housing 12. Walls 12 provide environmental protection, for example, to proof mass 22 as well as the components that suspend proof mass 22 above substrate 24.

Cap 14 is positioned over walls 12 to environmentally isolate the components of MEMS device 10. Generally, cap 14 is positioned after the fabrication of MEMS device 10 and includes a portion of a conductive silicon wafer material that is singulated to form cap 14. Cap 14 is conductive and is electrically connected to cap terminal 16 (as indicated by dashed line 18 representing the electrical connection).

Generally, during operation of MEMS device 10, the voltage of cap 14 is maintained at a given potential. This potential provides electrical isolation or shielding to the movable structure (e.g., proof mass 22) of MEMS device 10 as the moveable structure is held at approximately the same potential as cap 14 to avoid an electrostatic force being generated between proof mass 22 and cap 14. If the potential of cap 14 changes notably relative to the potential of proof mass 22, this could result in incorrect device readings based on electrostatic displacement of proof mass 22, rather than due to an external acceleration. Accordingly, cap 14 can provide both physical isolation to the components of MEMS device 10 as well as electrical isolation.

When MEMS device 10 is exposed to an acceleration in the z-axis, proof mass 22 rotates about axis 30. As proof mass 22 rotates, first section 38 either moves closer to, or further away from, sense plate 34. Similarly, second section 42 moves in the opposite direction from first section 38, either closer to, or away from, sense plate 36. Sense plates 34 and 36 are conductive capacitor plates. Each one of sense plates 34 and 36, in combination with a portion of proof mass 22 overlaying the sense plates, forms a capacitor. As the overlaying portion of proof mass 22 either moves closer to, or further away from, the respective sense plate 34 or 36, the capacitance of that capacitor changes. By monitoring the varying capacitance at each of sense plates 34 and 36, it is possible to derive a position of the first and second sections of proof mass 22 and, thereby, the acceleration being subjected to the MEMS device 10.

To facilitate testing of MEMS device 10, self test plate 50 is positioned over substrate 24. Self test plate 50 includes a conductive material and is electrically connected to self test plate terminal 52. By applying a voltage to self test plate terminal 52, the potential of self test plate 50 can be controlled. Accordingly, to test MEMS device 10, a non-zero positive voltage with respect to proof mass 22 is subjected to self test plate terminal 52. That non-zero voltage relative to proof mass 22 voltage is then established within self test plate 50. The voltage of self test plate 50 exerts an electro-static force on proof mass 22 causing proof mass 22 to become displaced towards self test plate 50. If that movement is not correctly detected by one or both of sense plates 34 and 36, MEMS device 10 may be considered to have failed the self test. Accordingly, self test plate 50 can be utilized to simulate the force of an acceleration acting upon MEMS device 10. Conversely, if that movement of proof mass 22 is accurately detected by one or both of sense plates 34 and 36, MEMS device 10 may be considered to have passed the self test.

Figure 2:
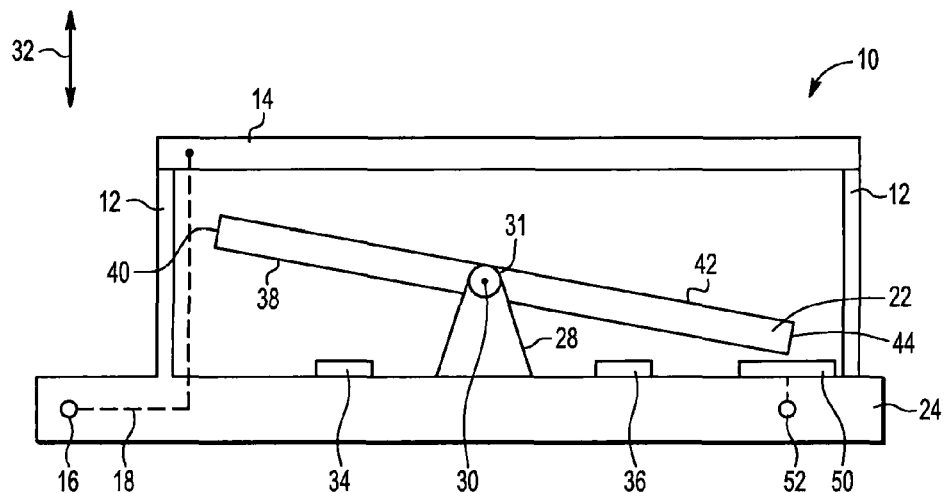
FIG. 2 is a side view of the MEMS device of FIG. 1A where a non-zero potential relative to the proof mass has been applied to a self test plate of the MEMS device.

To illustrate, FIG. 1A depicts MEMS device 10 in a steady state condition, where the self test plate 50 is at the same potential as the proof mass 22 potential and the device is only subjected to gravity (which as shown is configured to be a zero-acceleration condition). In such a condition, proof mass 22 is not deflected from its default position and cap terminal 16 is also set to the same potential as proof mass 22. In contrast, FIG. 2 depicts MEMS device 10 of FIG. 1A where a non-zero potential relative to the proof mass 22 potential has been applied to self test plate 50. As illustrated, proof mass 22 has been deflected from its resting position due to the electrostatic forces imparted by the potential of self test plate 50. This deflection is then measured by sense plates 34 and 36 as part of the self-test process.

As discussed above, in order to function correctly, in some cases, cap 14 of MEMS device 10 should be maintained at a potential roughly equal to that of the proof mass 22 to provide adequate electrical shielding from the effects of electrostatic force being placed on the proof mass 22. Unfortunately, in some MEMS devices, electrical connection 18 between cap 14 and cap terminal 16 can become disconnected, due to wire bond failure or for some other reason. The failure can occur in the region of connection 18 between terminal 16 and cap 14

(and in some cases in the region between substrate 24 and cap 14 depicted by element 18a on FIG. 1A). This can cause failure of the device because the potential of cap 14 is free to float to any potential value, which could cause random deflection of proof mass 22. However, as described above, the self test plate 50 and associated conventional testing procedures of a conventional MEMS device do not allow for the testing of the electrical connection between cap 14 and cap terminal 16.

The present system and method, therefore, provides a MEMS device configured to enable testing of the continuity of the cap connection in a particular MEMS device. The disclosure also provides a testing method that may be utilized in conjunction with conventional MEMS devices to test a cap connection. The testing methodology may be performed at, MEMS wafer level probe, final test, or in the field, after the MEMS device has been installed into a larger system.

In the present system, the cap of the MEMS device can be optionally electrically connected to either the cap terminal or the self test plate terminal, for example, through a switch. By selectively connecting and disconnecting the cap to the self test plate terminal during self test, it is possible to determine whether the cap terminal is electrically connected to the MEMS device cap. Specifically, and as described in detail below, when the self test plate terminal is connected to the cap, the movement of the proof mass under self test will be reduced (as compared to the condition where the cap terminal is not connected to the self test plate terminal), as the potential of the cap will be offset by some degree by the potential of the self test plate. If the connection between the cap terminal and cap is not correctly formed, a reduction in movement of the proof mass will be detected when both self test plate 50 and cap 14 are attempted to be bought to an elevated potential relative to the movable proof mass 22. This results because cap 14 (due to the failed electrical connection) does not provide an electrostatic force in the opposite direction to that generated by self test plate 50. This will result in a noticeable difference in the response/delta during self test and could be used to eliminate failing devices at probe, final device test, or at the customer as part of their turn-on testing.

Figure 3:
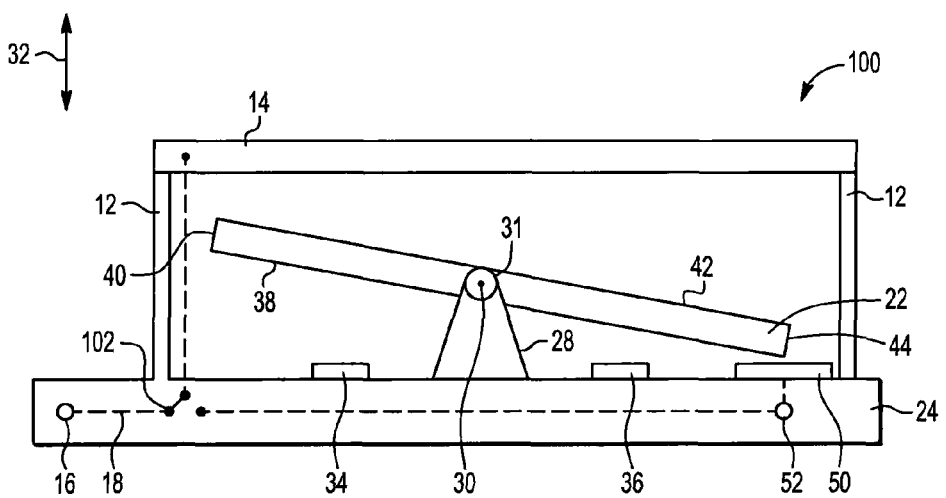
FIG. 3 is a side view of a MEMS device including a switch to optionally electrically connect a cap of the MEMS device to a self test plate.

FIG. 3 is a side view of MEMS device 100 including a switch 102 to optionally electrically connect the MEMS device cap to the self test plate. MEMS device 100 generally includes similar mechanical components to those of MEMS device 10 and, as such, elements that are the same in MEMS device 100 and MEMS device 10 have the same element numbers in FIG. 3. In other implementations, though, MEMS device 100 may include accelerometers, gyroscopes, or other MEMS devices that are protected by a conductive cap, and have sensitive circuitry that may need to be electrically isolated from electrostatic forces.

Figure 4:
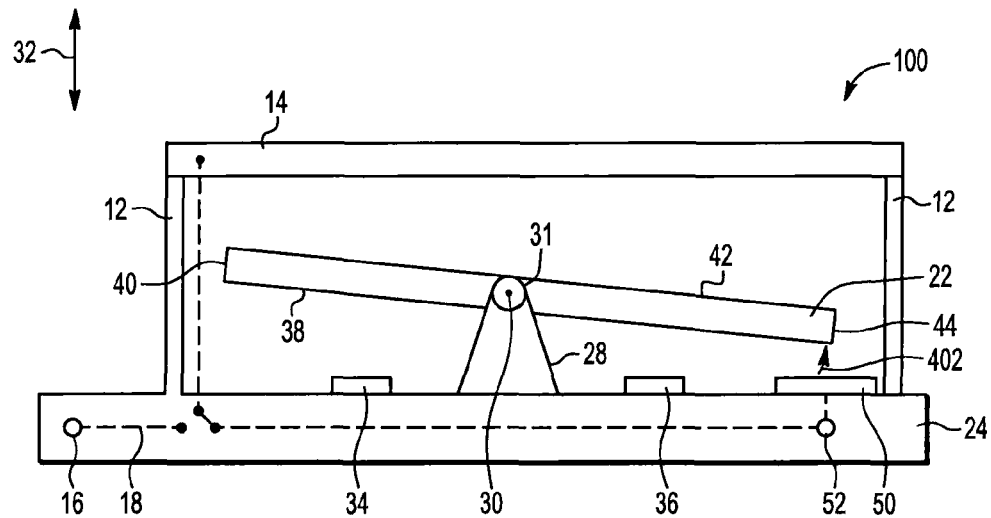
FIG. 4 is a side view showing the MEMS device of FIG. 3 where a switch has been configured to electrically connect a cap of the device to a self test plate terminal.
Figure 5:
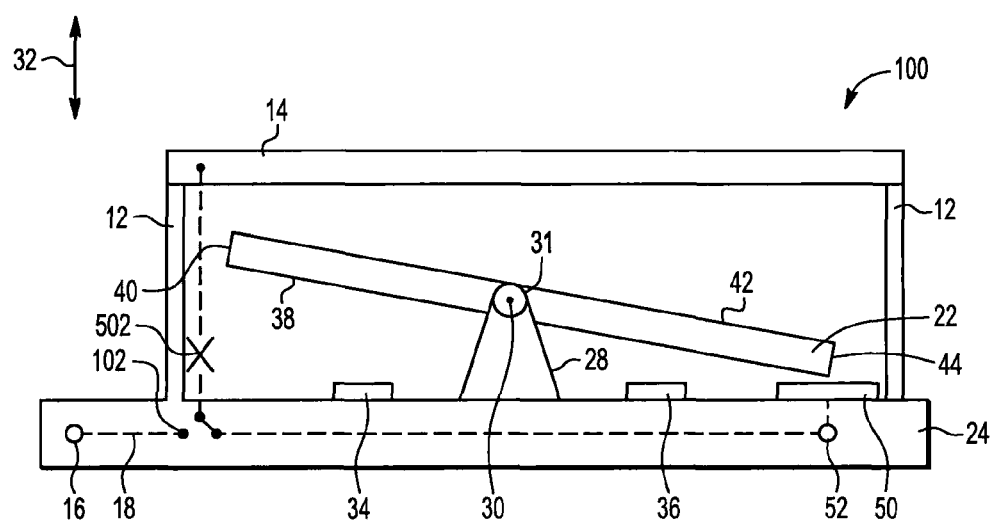
FIG. 5 is a side view showing the MEMS device of FIG. 3 where a cap connection has been broken.

In FIGS. 3-5, switch 102 is depicted as a hardware switch formed within or mounted to substrate 24 of MEMS device 100. In other implementations, though, switch 102 may instead be implemented by an application specific integrated circuit (ASIC) that is connected to cap 14 and self test plate 50. In that case, the ASIC may instead directly control the potential of both cap 14 and self test plate 50 and switch 102 would not be required in such an implementation.

In a first condition, switch 102 electrically connects cap 14 to cap terminal 16. In a second condition, switch 102 electrically connects cap 14 to self test plate terminal 52, providing cap 14 and self test plate 50 with the same voltage. Accordingly, switch 102 enables cap 14 to be placed at a first potential (associated with cap terminal 16) or at a second terminal (associated with self test plate terminal 52). In implementations where switch 102 is not present within MEMS device 100, these two potentials of cap 14 may be established by an external controller (e.g., an ASIC) that is directly connected to cap terminal 16 and supplies the desired cap potential directly to cap terminal 16. In such an implementation, switch 102 would not be required. In some implementations of MEMS device 100, walls 12 are formed integrally with cap 14 (and so varying a potential of cap 14 also varies a potential of walls 12). Sometimes, a well is etched into the underside of cap 14 to create a cavity in which at least a portion of the components of MEMS device 100 can reside. In some cases, walls 12 are formed by silk screening on a frit seal to surround the MEMS device and to add height to cap 14 and plate cap 14 above MEMS device 10. Cap 14 may be electrically connected to cap terminal 16 using any suitable connection technology, such as wire bonding, plating, or other conductive material placed between, such as conductive frit.

FIG. 3 depicts MEMS device 100 in a configuration where switch 102 is configured to establish an electrical connection between cap 14 and cap terminal 16. This allows for a self test procedure, such as that described above, to be carried out on MEMS device 100. In FIG. 3, therefore, a testing potential can be applied to self test plate terminal 52 causing proof mass 22 to become displaced. As discussed above, however, this test does not provide useful information regarding the quality of the electrical connection between cap 14 and cap terminal 16. In fact, the connection between cap 14 and cap terminal 16 could be broken and proof mass 22 may still be displaced sufficiently to allow the MEMS device to pass self test as the self test only analyzes a position delta for proof mass 22.

Accordingly, to test the connection between cap 14 and cap terminal 16 (including the portion of electrical connection 18 that spans the region between substrate 24 and cap 14), switch 102 is modified to electrically connect cap 14 to self test plate terminal 52. FIG. 4 shows the MEMS device of FIG. 3 where the switch has been configured to electrically connect the cap of the device to the self test plate terminal. Again, though, in implementations of MEMS device 100 where switch 102 is not included, the test illustrated in FIG. 4 may be simulated by subjecting a cap terminal and a self test plate terminal of a MEMS device to the same potential, rather than electrically connecting the cap and self test plate.

By connecting cap 14 to self test plate terminal 52, when the self test plate terminal 52 is energized by a potential (such as the potential used during a normal self test procedure), cap 14 is placed at the same potential. This may also be accomplished by setting cap 14 and self test plate 50 to the same potential. Consequently, at the same time self test plate 50 exerts an electro-static force on proof mass 22, pulling proof mass 22 downwards, cap 14 exerts a similar force of proof mass 22, pulling proof mass 22 (and, specifically, second section 42 of proof mass 22) in the opposite direction. This causes the deflection of proof mass 22 to be reduced (see arrow 402) as compared to the self test where cap 14 is only connected to cap terminal 16 and held at a shield voltage. This reduction in the displacement of proof mass 22 can therefore be detected to confirm the existence of electrical connection 18 to cap 14.

If the connection between cap 14 and cap terminal 16 were to be broken, as depicted in FIG. 5 where X 502 indicates a broken connection, cap 14 would not exert an electro-static force on proof mass 22. Consequently, the observed deflection of proof mass 22 would be approximately the same (as defined by the applicable testing standards) as the deflection observed when cap 14 is connected to cap terminal 16 (see, for example, FIG. 3).

Figures 6, 7:
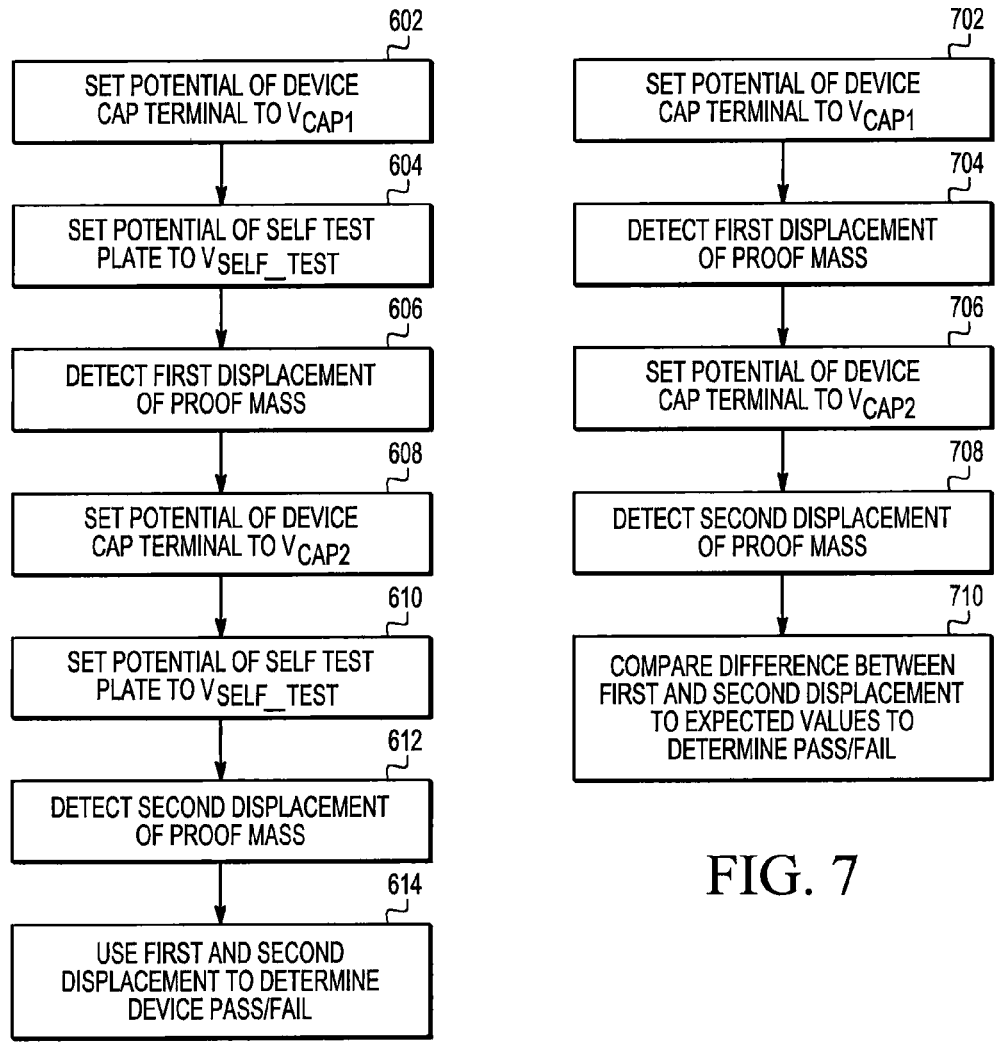
FIG. 6 is a flowchart depicting a method for testing a cap connection of a MEMS device in accordance with the present disclosure.
FIG. 7 is a flow chart illustrating an alternative method for cap connection testing in a MEMS device.

FIG. 6 is a flowchart depicting a method for testing a cap connection of a MEMS device in accordance with the present disclosure. The testing methodology illustrated in FIG. 6 generally involves setting a potential of a self test plate of the MEMS device to a consistent voltage while the potential of the device's cap terminal is varied. If the electrical connection between the device's cap terminal and the cap is good, the varying voltage applied to the device's cap terminal with cause a corresponding change in the potential of the device's cap. The varying potential of the cap can then be detected in the form of movement of the device's proof mass resulting from applied electrostatic forces generated by the cap.

The depicted cap connection test method may be used, for example, to test the operation of and, specifically, the cap connection of MEMS device 100, described above. However, in other implementations, the method depicted in FIG. 6 may be utilized with a conventional MEMS device (having a separate cap terminal and self test plate terminal), where the method is implemented by a controller (e.g., an ASIC) that is external to the MEMS device and has the capability of independently setting a potential for both the MEMS device cap and the self test plate. As such, the external controller may have an independent connection formed to both the cap terminal and self test plate terminal of the MEMS device being tested.

The method generally includes two stages. In the first stage (steps 602, 604, and 606) the device is tested under conditions where the device's cap terminal is set at a first voltage potential (generally a potential appropriate for the cap to provide electrical isolation to the device—in some cases, a potential that is approximately equal to a potential of the device's proof mass). In this first set of conditions, the device's self test plate is used to perform a first test of proof mass displacement detection. In a second stage (steps 608, 610, and 612) the device is tested under conditions where the device's cap terminal is set to a second potential different than the first potential (in one implementation, the cap terminal is set to the same potential as that of the self test plate). In the second set of conditions, the device's self test plate is used to perform a second test of proof mass displacement. By analyzing the result of both test stages, a determination can be made as to the quality of the electrical connection between the cap terminal and the cap of the device.

Accordingly, in step 602 a potential of the device's cap terminal is set to a first voltage $V_{CAP1}$. $V_{CAP1}$, in one implementation, is an appropriate shield voltage potential selected to enable normal operation of the MEMS device. This potential may be approximately the same voltage as a voltage of the MEMS device's proof mass in order to prevent an electrostatic force developing between the cap and proof mass. The potential of the MEMS device's cap may be established by subjecting a cap terminal (e.g., cap terminal 16) to a particular potential. For example, an external circuit or controller that is connected to the MEMS device may apply a particular voltage to the cap terminal as it does to the movable proof mass 22. Alternatively, during fabrication of the MEMS device an external testing device may be used to supply the desired voltage or connection to the cap terminal, as it does to the movable mass and/or the sense plates.

With the cap terminal of the MEMS device set to a potential of $V_{CAP1}$, the potential of the self test plate or plates is changed from the same potential as the proof mass (as to not affect the proof mass), to a different voltage potential $V_{SELF\_TEST}$, which is a voltage designed and characterized to be a potential suitable for shifting the movable proof mass for measurable testing of the MEMS device in step 604. The potential of the self test plate subjects the proof mass of the MEMS device to an electrostatic force, causing the proof mass to move or become deflected from its resting position.

Accordingly, after setting the voltage of the self test plate, in step 606 a first displacement (or position) of the MEMS device's proof mass is detected or measured, for example using sense plates 34 and 36.

In step 608, the cap terminal is set to a second potential $V_{CAP2}$ which can be a voltage that has been designed and characterized to create enough electrostatic force on the proof mass 22 to create measurable and usable data and is, in some cases, greater than $V_{CAP1}$. In one implementation, this step may be achieved by connecting the cap to the self test plate (using, for example, switch 102 of MEMS device 100) and then subjecting the self test plate to a particular potential (e.g., $V_{SELF\_TEST}$) Alternatively, the potential of the cap may be established by subjecting the cap terminal to $V_{CAP2}$. In step 610, the self test plate of the device is set to $V_{SELF\_TEST}$ (in various implementations, step 610 may be implemented as a continuation of step 604). And in step 612, a second displacement of the MEMS device's proof mass is detected or measured, for example using sense plates 34 and 36.

If the electrical connection between the device's cap terminal and cap is good, the first displacement measured in step 606 will be different than the second displacement measured in step 612. The difference in displacement results from the cap, when set to $V_{CAP2}$, exerting a force upon the proof mass that opposes the force exerted by the self test plate. This opposing force supplied by the cap reduces the displacement of the MEMS device's proof mass when the self test plate is subjected to $V_{SELF\_TEST}$. When the cap terminal is set to a potential of $V_{CAP1}$, the cap of the MEMS device does not exert the same force upon the proof mass. If, however, the connection between the cap terminal and cap is bad, the cap will not be set to $V_{CAP2}$ (instead the cap will be at a floating voltage) and, consequently, will not exert an opposing force on the proof mass.

Accordingly, in step 614, the first displacement measured in step 606 and the second displacement measured in step 612 are compared to determine whether the device has a good connection formed between the cap terminal and device cap. Based upon that analysis, therefore, the device may be passed or failed for the cap connection test. In one implementation, if the two measurements are approximately equal, that indicates that the voltage delta applied to the cap terminal (the different between $V_{CAP1}$ and $V_{CAP2}$) had no (or only negligible) affect on the displacement of the proof mass. This means that the connection between the MEMS device's cap terminal and cap is not good (that is, the cap was at a floating potential when both displacement measurements were taken) and the device can be failed.

The threshold difference between the first and second measured displacement that determines whether the device passes or fails can be determined by the use of design and characterization data. As is known in the industry, a number of known-good parts and known-bad parts can be tested to determine the anticipated differences between the first and second measured displacements for known-good and known-bad parts. That testing data may then be utilized to determine standards or threshold values by which the two displacement measurements can be evaluated to determine to a sufficient likelihood whether a particular device has passed or failed the cap connection test. Accordingly, by comparing the two measurements or delta thereof to established specifications (based on design and device characterization conducted to determine if the measured displacement values should be considered equal or not) the device can either be passed or failed for the cap connection test. The testing standards, in addition to defining whether a particular displacement value indicates whether a device being tested passes, may also proscribe testing procedures that define a particular timing regime for when the displacement measurements are acquired after particular testing potentials have been applied to the various parts of the MEMS device. In that case, the defined timing requirements for the testing procedure may be determined by characterizing the temporal responses of a number of known-good and known-bad parts in response to applied testing conditions.

FIG. 7 is a flow chart illustrating an alternative method for cap connection testing in a MEMS device. In the method of FIG. 7, different potentials are applied to the cap terminal of the MEMS device being tested. If the connection between the device's cap terminal and the cap is good, the varying voltage applied to the device's cap terminal with cause a corresponding change in the potential of the device's cap. The varying potential of the cap can then be detected in the form of movement of the device's proof mass. During the execution of the method depicted in FIG. 7, the potential of the self test plate of the MEMS device is generally held at a constant potential (e.g., the same potential as that of the proof mass of the MEMS device). The illustrated method may be utilized to test a cap connection in MEMS device 100, or, alternatively, may be utilized to test a conventional MEMS device having separate cap and self test plate terminals.

In step 702 a potential of the device's cap terminal is set to a first voltage $V_{CAP1}$. $V_{CAP1}$, in one implementation, is an appropriate shield voltage potential selected to enable normal operation of the MEMS device, but any appropriate potential may be utilized. This potential may be approximately the same voltage as a voltage of the MEMS device's proof mass in order to prevent an electrostatic force developed between the cap and proof mass. The potential of the MEMS device's cap may be established by subjecting a cap terminal (e.g., cap terminal 16) to a particular potential. For example, an external circuit or controller that is connected to the MEMS device may apply a particular voltage to the cap terminal as it does to the movable proof mass 22. Alternatively, during fabrication of the MEMS device an external testing device may be used to supply the desired voltage or connection to the cap terminal, as it does to the movable mass and/or the sense plates.

With the cap terminal of the MEMS device set to a potential of $V_{CAP1}$, in step 704 a first displacement of the MEMS device's proof mass is detected or measured, for example using sense plates 34 and 36.

In step 706, the cap terminal is set to a second potential $V_{CAP2}$ which can be a voltage that has been designed and characterized to create enough electrostatic force on the proof mass 22 to create measurable and usable data as compared to the displacement observed when the device cap terminal is set to $V_{CAP1}$. In step 708, after subjecting the cap terminal to $V_{CAP2}$, a second displacement of the MEMS device's proof mass is detected or measured, for example using sense plates 34 and 36.

If the electrical connection between the device's cap terminal and cap is good, the first displacement measured in step 704 will be different than the second displacement measured in step 708. The difference in displacement results from the cap, when set to $V_{CAP2}$, exerting a different force upon the proof mass than when the cap was set to $V_{CAP1}$. This differing force changes the displacement of the MEMS device's proof mass. If, however, the connection to the device's cap is bad, the two different cap voltages will not affect the proof mass displacements because the cap will not have achieved either potential due to the bad connection. Instead, the cap will have been at a floating potential for both displacement measurements.

Accordingly, in step 710, the first displacement measured in step 704 and the second displacement measured in step 708 are compared to determine whether the device has a good connection formed between the cap terminal and device cap. Based upon that comparison, therefore, the device may be passed or failed for the cap connection test. In one implementation, if the two measurements are approximately equal, that indicates that the voltage delta applied to the cap terminal (the different between $V_{CAP1}$ and $V_{CAP2}$) had no affect on the displacement of the proof mass. This means that the connection between the MEMS device's cap terminal and cap is not good and the device can be failed. The threshold difference between the first and second measured displacement that determines whether the device passes or fails can be determined by the use of design and characterization data. As is known in the industry, a number of known-good parts and known-bad parts can be tested to determine the anticipated differences between the first and second displacement measurements for known-good and known-bad parts. That testing data may then be utilized to determine standards by which the two displacement measurements can be evaluated to determine whether a particular device has passed or failed the test.

Accordingly, by comparing the two measurements or delta thereof to established specifications (based on design and device characterization conducted to determine if the output should be considered equal or not) the device can either be passed or failed for the cap connection test.

In some implementations of the present method, a displacement of the device's proof mass 22 is only measured once to evaluate the connection between the device's cap terminal and cap. For example, in some implementations of the method of FIG. 7, steps 702 and 704 may effectively be performed when the device is at a rest state, namely the voltage of the cap terminal is set to the same voltage as that of the proof mass 22 and the deflection of the proof mass 22 is, by definition, zero. In that case, a single non-voltage may be applied to the device's cap terminal (e.g., in step 706) and the proof mass's deflection from its resting position would be measured in step 708. That deflection can then be utilized to evaluate the connection between the device's cap terminal and cap, for example, by comparing that deflection to a threshold value.

In other implementations, the movement of proof mass 22 over time in response to different voltages being applied to the device's cap terminal can be utilized to evaluate the electrical connection between the cap terminal and the cap. For example, through the testing and analysis of known-good and known-bad devices, it may be determined that a good connection between the cap terminal and cap results in proof mass 22 moving a particular distance in response to a voltage applied to the cap terminal within a particular time frame (e.g., a number of milliseconds). Similarly, it may be determined that in devices in which the connection between the cap terminal and cap is not good (but possibly not a completely open connection—the connection may only have an increased resistance and/or impedance over a connection that would otherwise be characterized as good), it may take more time for proof mass 22 to move the same distance (or simply to begin moving). Consequently, it may be possible to identify a bad connection between the cap terminal and cap by supplying a voltage to the cap terminal and the monitoring a period of time before the proof mass 22 of the device begins to move, or moves a particular distance.

Accordingly, in one example testing method a testing voltage may be applied to a device's cap terminal. At the same time, a timer may be started to measure a time duration from the application of the testing potential to the cap terminal until the device's proof mass 22 begins to move (as detected by sense plates 34 and 36, for example) or until the device's proof mass 22 moves a particular distance (again, as detected by sense plates 34 and 36, for example). If that measured time duration falls below a particular threshold (the threshold being determined by the testing of known-good and known-bad devices), the connection between the device's cap terminal and cap may be determined to be a good connection. Alternatively, if that measured time duration is greater than a particular threshold, the connection between the device's cap terminal and cap may be determined to be a bad connection.

Figure 8:
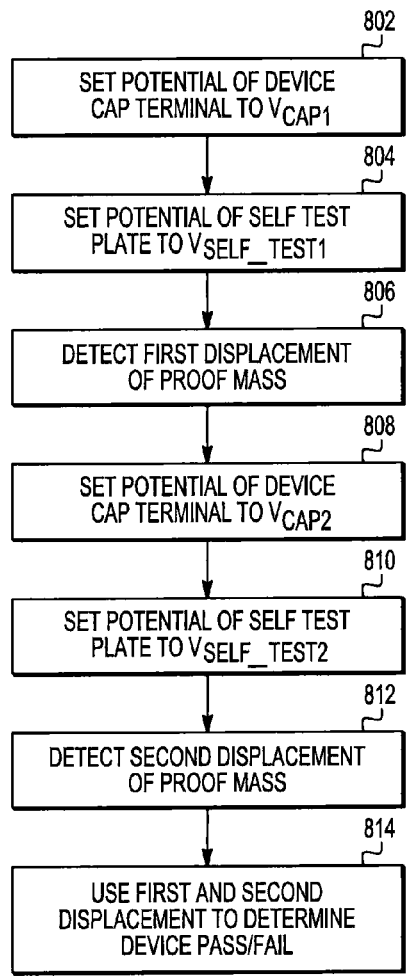
FIG. 8 is a flow chart illustrating an alternative method for cap connection testing in a MEMS device in a which a potential of a device cap and a self test plate are utilized to perform the test.

FIG. 8 is a flow chart illustrating an alternative method for cap connection testing in a MEMS device in which a potential of a device cap and a self test plate are utilized to perform the test. In the method illustrated in FIG. 8, the potential of both the device cap and self test plate are each modified in different steps of the test.

In step 802 a potential of the device's cap terminal is set to a first voltage $V_{CAP1}$. $V_{CAP1}$, in one implementation, is an appropriate shield voltage potential selected to enable normal operation of the MEMS device, though other potentials may be utilized. The potential of the MEMS device's cap may be established by subjecting a cap terminal (e.g., cap terminal 16) to a particular potential. For example, an external circuit or controller that is connected to the MEMS device may apply a particular voltage to the cap terminal as it does to the movable proof mass 22. Alternatively, during fabrication of the MEMS device an external testing device may be used to supply the desired voltage or connection to the cap terminal, as it does to the movable mass and/or the sense plates.

With the cap of the MEMS device set to a potential of $V_{CAP1}$, the potential of the self test plate or plates is set to a voltage potential of $V_{SELF\_TEST1}$, which may be a voltage designed and characterized to be a potential suitable for shifting the movable proof mass for measurable testing of the MEMS device in step 804. The potential of both the self test plate and the device cap subject the proof mass of the MEMS device to a first electrostatic force, causing the proof mass to move or become deflected from its resting position. Accordingly, after setting the voltage of the self test plate and cap terminal, in step 806 a first displacement of the MEMS device's proof mass is detected or measured, for example using sense plates 34 and 36. Note that in various implementations, the ordering of steps 804 and 806 may be reversed, or both steps may be performed at the same time.

In step 808, the cap terminal of the MEMS device is set to a second potential $V_{CAP2}$, which is a voltage that is different from $V_{CAP1}$. In step 810, the self test plate of the device is set to $V_{SELF\_TEST2}$, which is a voltage that is different than $V_{SELF\_TEST1}$.

In step 812, a second displacement of the MEMS device's proof mass is detected or measured, for example using sense plates 34 and 36. Note that in various implementations, the ordering of steps 808 and 810 may be reversed, or both steps may be performed at the same time.

In step 814, the first displacement measured in step 806 and the second displacement measured in step 812 are compared to determine whether the device has a good connection formed between the cap terminal and device cap. Based upon that analysis, therefore, the device may be passed or failed for the cap connection test. For the method depicted in FIG. 8, a number of known-good parts and known-bad parts can be tested using the various voltages $V_{CAP1}$, $V_{CAP2}$, $V_{SELF\_TEST1}$, and $V_{SELF\_TEST2}$ to determine the anticipated displacement of the proof mass that should results for each voltage combination. That testing data may then be utilized to determine standards by which the two displacement measurements can be evaluated to determine whether a particular device has passed or failed the test.

Accordingly, by comparing the two measurements or delta thereof to established specifications (based on design and device characterization conducted to determine if the output should be considered equal or not) the device can either be passed or failed for the cap connection test.

Depending upon the type of device being tested, it may be helpful to perform some initial testing with devices having known-good cap connections and known-bad cap connections in order to characterize the attributes or a good component and a bad component. Such testing, for example, would make it possible to determine an anticipated difference between the first and second measured displacements for a part that has a good cap connection. The testing could also provide information regarding the maximum variability between the first and second displacement measurements that would be detected in a device having a bad cap connection.

In accordance with the present disclosure, therefore, it is possible to test an electrical connection between a cap terminal and a cap of a MEMS device. The cap connection testing may be implemented to test the connection in devices that are, or have just been, fabricated. For example, when multiple MEMS devices are fabricated over a single substrate or wafer, an external testing device, such as a wafer-level probe, may be utilized to implement one or more of the testing methods illustrated in FIGS. 6-8, and described herein, to verify the cap electrical connection in one or more of the devices formed over the substrate. In some cases, every device formed over the substrate is tested, but in other implementations, only a subset of the devices formed over the substrate may be tested.

Figure 9:
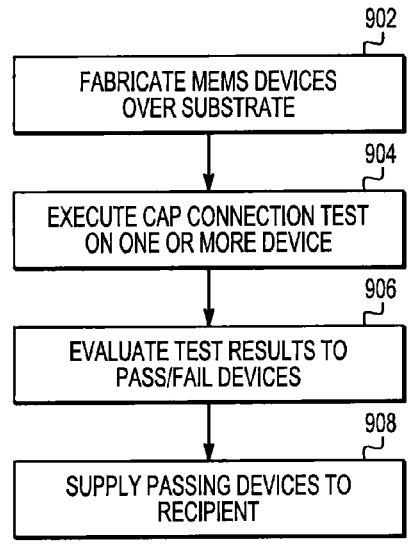
FIG. 9 is a flowchart illustrating a method for testing a cap connection in one or more MEMS devices formed over a substrate.

FIG. 9, for example, shows a method for testing a cap connection in one or more MEMS devices formed over a substrate. In step 902, one or more devices are fabricated over a substrate. The devices include caps and cap terminals and, during fabrication, it is intended that the cap and cap terminal of each device be electrically connected to one another.

After the devices are fabricated, in step 904, a cap connection test is executed on one or more of the devices that were fabricated in step 902. The test may include, for example, one or more of the methods illustrated in FIG. 6-8, or as further described herein. In one implementation, the test may be executed by a wafer-level probe or other devices configured to execute the methods of FIGS. 6-8, for example. After the test is performed, in step 906 the test results are analyzed to determine whether the devices being tested passed or failed the cap connection test. Depending upon the test results, additional tests may be performed to test other devices formed over the same substrate. For example, if, in a first test only a subset of the devices on a particular substrate are tested, and the failure rate of those tests exceeds a particular threshold value, testing procedures may require that all devices on the substrate be tested. In some cases, though, if the initial test rate has a failure rate that is too high, all devices on the substrate may be failed.

After analyzing the test results to identify a number of passing devices, the substrate is singulated and, in step 908, the devices that were considered to have passed the test are sent to a recipient, such as a customer, for installation into a larger device or system.

Figure 10:
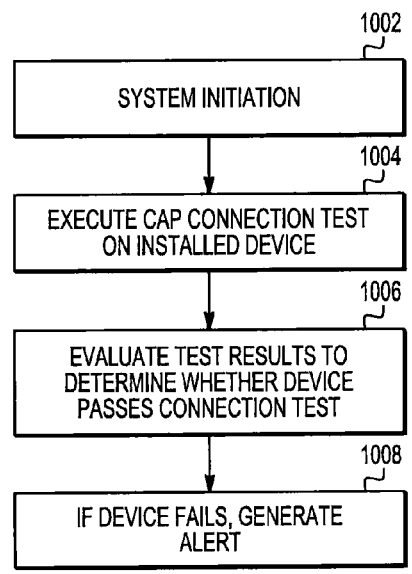
FIG. 10 is a flowchart illustrating a method for testing a cap connection of a MEMS device after the device has been installed into a larger system.

In other cases, the testing methodologies can be utilized to test devices that are in the field. For example, when a MEMS device is installed into a larger system, upon startup the larger system may be configured to perform one or more of the testing approaches described herein to verify an operation of the installed MEMS device. When the MEMS devices are installed into a vehicle, for example, upon starting the vehicle, the installed MEMS device can be tested using the present methodologies to ensure proper operation of the MEMS device and, specifically, the electrical connection between a cap terminal of the device and the device's cap. FIG. 10, for example, illustrates a method for testing a cap connection of a MEMS device after the device has been installed into a larger system. In FIG. 10, the test is described as being performed at the initiation of the larger system that contains the MEMS device, however in various implementations, the larger system may perform the test at any time to verify operation of installed MEMS devices.

In step 1002 the system containing the installed MEMS device is initiated or powered-up. After initiation, in step 1004, the system executes a cap connection test on a MEMS device that is a component of the system. For example, the system may perform one or more of the tests illustrated in FIGS. 6-8 and described herein. After performing the test, the system can analyze the results of the test to determine whether the installed MEMS device passed the cap connection test in step 1006. If it is determine that the MEMS device has not passed the cap connection test, the system may take any appropriate action, such as generate an alert in step 1008. If the system is a vehicle and the MEMS device forms part of the vehicle's air bag deployment mechanism, for example, the system may alert a driver of the vehicle to a potential failure in the vehicle's air bag system. In other cases, if the system determines that the cap connection for the MEMS device is bad, the system may instead rely upon other sensors (perhaps redundant devices) to make appropriate measurements. Alternatively, if the system detects that a particular MEMS device has failed the cap connection test, a system alert may be generated and other components of the system may be notified so that they may take appropriate action.

An embodiment of a method includes setting a potential of a cap terminal of a device to a first voltage, setting a potential of a self test plate of the device to a testing voltage, and detecting a first displacement of a proof mass of the device when the cap terminal is set to the first voltage and the self test plate is set to the testing voltage. The method includes setting a potential of the cap terminal of the device to a second voltage, detecting a second displacement of the proof mass of the device when the cap terminal is set to the second voltage and the self test plate is set to the testing voltage, and comparing the first displacement and the second displacement to evaluate an electrical connection between the cap terminal and a cap of the device.

An embodiment of a method includes detecting a first displacement of a proof mass of a device when a potential of a cap terminal of the device is set to a first voltage, detecting a second displacement of the proof mass of the device when the potential of the cap terminal of the device is set to a second voltage, and comparing the first displacement and the second displacement to evaluate an electrical connection between the cap terminal and a cap of the device.

An embodiment of a method includes fabricating a device on a substrate. The device includes a cap, a cap terminal, and a proof mass. The method includes testing an electrical connection between the cap and the cap terminal by detecting a first displacement of the proof mass of the device when a potential of the cap terminal of the device is set to a first voltage, detecting a second displacement of the proof mass of the device when the potential of the cap terminal of the device is set to a second voltage, and comparing the first displacement and the second displacement to determine whether the cap terminal and the cap of the device are electrically connected, The method includes, when the cap terminal and the cap of the device are electrically connected, singulating the substrate, and providing the device to a recipient.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of testing a device, the method comprising:
setting a potential of a cap terminal of the device to a first voltage;
setting a potential of a self test plate of the device to a testing voltage;
detecting a first displacement of a proof mass of the device when the cap terminal is set to the first voltage and the self test plate is set to the testing voltage;
setting a potential of the cap terminal of the device to a second voltage;
detecting a second displacement of the proof mass of the device when the cap terminal is set to the second voltage and the self test plate is set to the testing voltage; and
comparing the first displacement and the second displacement to evaluate an electrical connection between the cap terminal of the device and a cap of the device.

2. The method of claim 1, wherein comparing the first displacement and the second displacement to evaluate the electrical connection between the cap terminal and the cap includes determining a difference between the first displacement and the second displacement.

3. The method of claim 2, including comparing the difference between the first and second displacement to a threshold value.

4. The method of claim 1, wherein the device is an accelerometer.

5. The method of claim 1, wherein the second voltage is the testing voltage.

6. The method of claim 1, wherein the first voltage is a voltage of the proof mass of the device.

7. A method of testing a device, the method comprising:
detecting a first displacement of a proof mass of the device when a potential of a cap terminal of the device is set to a first voltage;
measuring a time period from when the potential of the cap terminal of the device is set to the first voltage to the first displacement of the proof mass is detected; and
comparing the measured time period to a threshold to evaluate an electrical connection between the cap terminal of the device and a cap of the device.

8. The method of claim 7, including:
detecting a second displacement of the proof mass of the device when the potential of the cap terminal of the device is set to a second voltage; and
comparing the first displacement and the second displacement to evaluate the electrical connection between the cap terminal and the cap of the device.

9. The method of claim 8, including, before detecting a first displacement of a proof mass of the device, setting a potential of a self test plate of the device to a first self test voltage.

10. The method of claim 9, including, before detecting a second displacement of a proof mass of the device, setting a potential of a self test plate of the device to a second self test voltage.

11. The method of claim 10, wherein the second self test voltage is the same as the first self test voltage.

12. The method of claim 8, wherein comparing the first displacement and the second displacement to evaluate the electrical connection between the cap terminal and the cap includes determining a difference between the first displacement and the second displacement.

13. The method of claim 12, including comparing the difference between the first and second displacement to a threshold value.

14. A method of manufacturing a device, the method comprising:
    fabricating the device on a substrate, the device including a cap, a cap terminal, and a proof mass;
    testing an electrical connection between the cap and the cap terminal by:
        detecting a first displacement of the proof mass of the device when a potential of the cap terminal of the device is set to a first voltage,
        detecting a second displacement of the proof mass of the device when the potential of the cap terminal of the device is set to a second voltage, and
        comparing the first displacement and the second displacement to determine whether the cap terminal and the cap of the device are electrically connected; and
    when the cap terminal and the cap of the device are determined to be electrically connected,
        singulating the substrate, and
        providing the device to a recipient.

15. The method of claim 14, including, when the cap terminal and the cap of the device are determined to be not electrically connected:
    discarding the device.

16. The method of claim 14, wherein comparing the first displacement and the second displacement to determine whether the cap terminal and the cap of the device are electrically connected includes determining a difference between the first displacement and the second displacement.

17. The method of claim 16, including comparing the difference between the first and second displacement to a threshold value.

18. The method of claim 14, wherein the device is an accelerometer.

19. The method of claim 14, including:
    when detecting the first displacement, setting a potential of a self test plate of the device to a self test voltage; and
    when detecting the second displacement, setting the potential of the self test plate of the device to the self test voltage.

* * * * *